United States Patent
Masuda et al.

(10) Patent No.: US 8,772,113 B2
(45) Date of Patent: Jul. 8, 2014

(54) METHOD FOR MANUFACTURING SILICON CARBIDE SEMICONDUCTOR DEVICE

(71) Applicant: Sumitomo Electric Industries, Ltd., Osaka (JP)

(72) Inventors: Takeyoshi Masuda, Osaka (JP); Yu Saitoh, Osaka (JP); Kenji Hiratsuka, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/944,562

(22) Filed: Jul. 17, 2013

(65) Prior Publication Data

US 2014/0057424 A1 Feb. 27, 2014

Related U.S. Application Data

(60) Provisional application No. 61/692,462, filed on Aug. 23, 2012.

(30) Foreign Application Priority Data

Aug. 23, 2012 (JP) ................................ 2012-183931

(51) Int. Cl.
*H01L 21/336* (2006.01)
(52) U.S. Cl.
USPC ................... 438/270; 438/589; 257/E21.429

(58) Field of Classification Search
USPC ..................... 438/590; 257/E21.4, E21.428
See application file for complete search history.

(56) References Cited

U.S. PATENT DOCUMENTS

2012/0309195 A1 12/2012 Masuda
2013/0112996 A1  5/2013 Masuda

FOREIGN PATENT DOCUMENTS

JP       2002-237494 A   8/2002
WO   WO-2012/017798 A1   2/2012

OTHER PUBLICATIONS

International Search Report and Written Opinion in PCT International Application No. PCT/JP2013/068849, dated Oct. 8, 2013.

*Primary Examiner* — Cheung Lee
(74) *Attorney, Agent, or Firm* — Venable LLP; Michael A. Sartori (57) ABSTRACT

A silicon carbide substrate is prepared which has a main surface covered with a silicon dioxide layer. In the silicon dioxide layer, an opening is formed by etching. In the opening, a residue resulting from the etching is on the silicon carbide substrate. The residue is removed by plasma etching in which only an inert gas is introduced. After removing the residue, under heating, a reactive gas is supplied to the silicon carbide substrate covered with the silicon dioxide layer having the opening formed therein. In this way, a trench is formed in the main surface of the silicon carbide substrate.

5 Claims, 12 Drawing Sheets

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, in particular, a method for manufacturing a silicon carbide semiconductor device including a silicon carbide substrate having a trench formed therein.

2. Description of the Background Art

WO 2012/017798 discloses a method for manufacturing a MOSFET (Metal Oxide Semiconductor Field Effect Transistor) including a silicon carbide substrate having a trench formed therein. According to this method, the trench is formed as follows, for example. First, a silicon oxide film is formed on the silicon carbide substrate using a CVD (Chemical Vapor Deposition) method. On this silicon oxide film, a resist film having a predetermined opening pattern is formed using a photolithography method. Using this resist film as a mask, the silicon oxide film is etched. Accordingly, a mask layer having an opening pattern is formed on the silicon carbide substrate. Using this mask layer as a mask, RIE is performed to form a preliminary trench in the silicon carbide substrate. Next, thermal etching is performed to form a final trench in the silicon carbide substrate.

In the above-described method, when the silicon oxide film is provided with the opening pattern through the etching, etching residues can be on the silicon carbide substrate in the opening pattern. If thermal etching is performed when such residues are on the silicon carbide substrate, projections corresponding to the residues can be formed within the trench. In other words, the trench can be provided with surface roughness. If a gate insulating film is formed on the trench having such a rough surface, the silicon carbide semiconductor device can have a decreased breakdown voltage. In the case where RIE is performed preliminarily prior to the thermal etching, the residues can be removed to a certain extent. However, a reaction product resulting from the RIE causes formation of new residues or the like. This makes it difficult to sufficiently remove the residues. Moreover, the surface roughness caused by the RIE can result in surface roughness after the subsequent thermal etching. Accordingly, the breakdown voltage can be decreased as with the above-described case.

SUMMARY OF THE INVENTION

The present invention has been made to solve such a problem and has its object to provide a method for manufacturing a silicon carbide semiconductor device so as to suppress breakdown voltage from being decreased due to surface roughness in a trench.

A method for manufacturing a silicon carbide semiconductor device in the present invention includes the following steps. A silicon carbide substrate is prepared which has a main surface covered with a silicon dioxide layer. A photoresist layer having a pattern is formed on the silicon dioxide layer. An opening is formed in the silicon dioxide layer through etching with the photoresist layer being used as a mask, so as to expose a portion of the main surface through the opening. A residue resulting from the etching is on the portion of the main surface exposed through the opening. The residue is removed by plasma etching in which only an inert gas is introduced. After the step of removing the residue, a trench having a side wall surface is formed in the main surface of the silicon carbide substrate by supplying a reactive gas, under heating, to the silicon carbide substrate having the main surface covered with the silicon dioxide layer having the opening formed therein. A gate insulating film is formed on the side wall surface of the trench. A gate electrode is formed on the gate insulating film.

According to this manufacturing method, only the inert gas is introduced during the plasma etching for removing the residue. Accordingly, when removing the existing residue, new residues can be prevented from being formed by chemical reaction. Hence, thermal etching can be performed with fewer residues. Accordingly, the breakdown voltage can be suppressed from being decreased due to the surface roughness in the trench formed by the thermal etching.

Preferably, the plasma etching is performed under an atmosphere having a remaining oxygen content of 1% or less. Accordingly, new residues can be suppressed from being formed due to oxidation reaction.

Preferably, the reactive gas contains a halogen gas. Accordingly, the thermal etching can be performed using a reaction between the halogen gas and the silicon carbide.

Preferably, the reactive gas contains oxygen gas. Accordingly, carbon generated during the thermal etching is removed efficiently, thereby increasing a rate of the thermal etching.

Preferably, a number density of projections each having a height of 10 nm or more is $1 \text{ cm}^{-2}$ or less on the main surface having the trench formed therein. Accordingly, the breakdown voltage can be sufficiently suppressed from being decreased due to surface roughness in the trench.

As described above, according to the present invention, the breakdown voltage can be suppressed from being decreased due to the surface roughness in the trench.

The foregoing and other objects, features, aspects and advantages of the present invention will become more apparent from the following detailed description of the present invention when taken in conjunction with the accompanying drawings.

DESCRIPTION OF THE PREFERRED
EMBODIMENTS

The following describes an embodiment of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "−" (bar) above a numeral, but is expressed by putting the negative sign before the numeral in the present specification.

Figure 1:
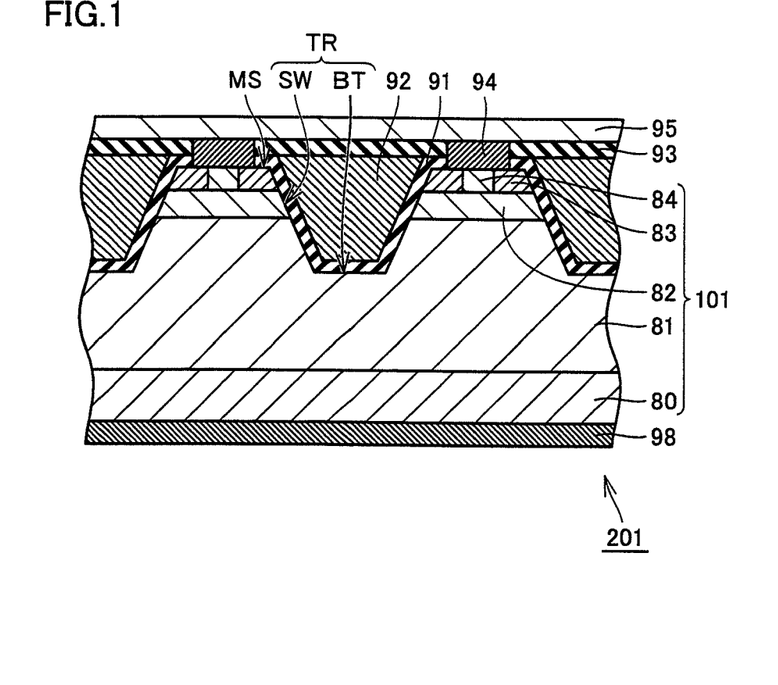
FIG. 1 is a partial cross sectional view schematically showing a configuration of a silicon carbide semiconductor device in one embodiment of the present invention.
Figure 2:
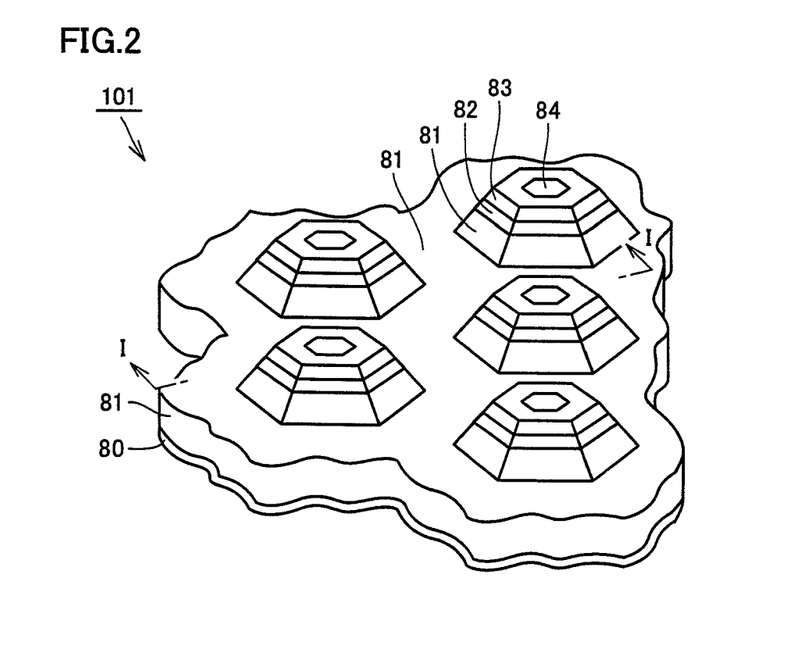
FIG. 2 is a partial perspective view schematically showing a shape of a silicon carbide substrate included in the silicon carbide semiconductor device of FIG. 1.

As shown in FIG. 1 and FIG. 2, a MOSFET 201 (silicon carbide semiconductor device) of the present embodiment includes an epitaxial substrate 101 (silicon carbide substrate), gate oxide films 91 (gate insulating film), gate electrodes 92, interlayer insulating films 93, source electrodes 94, a source wiring layer 95, and a drain electrode 98. Epitaxial substrate 101 is made of silicon carbide, preferably, has a polytype of 4H. Specifically, epitaxial substrate 101 has a single-crystal substrate 80, and an epitaxial layer provided thereon to construct a main surface MS. This epitaxial layer has an n drift layer 81, p base layers 82, n regions 83, and p contact regions 84.

Single-crystal substrate 80 has n type (first conductivity type) conductivity. N drift layer 81 is an epitaxial layer formed on single-crystal substrate 80. N drift layer 81 has n type conductivity. N drift layer 81 preferably has an impurity concentration lower than that of single-crystal substrate 80. N drift layer 81 preferably has a donor concentration of not less than $1\times10^{15}$ cm$^{-3}$ and not more than $5\times10^{16}$ cm$^{-3}$, for example, $8\times10^{15}$ cm$^{-3}$.

Each of p base layers 82 has p type conductivity. P base layer 82 is provided on n drift layer 81. P base layer 82 has an impurity concentration of, for example, $1\times10^{18}$ cm$^{-3}$. Each of n regions 83 has n type conductivity. N region 83 is provided on p base layer 82 so as to be separated from n drift layer 81 by p base layer 82. Each of p contact regions 84 has p type conductivity. P contact region 84 is connected to p base layer 82.

A trench TR is provided in the surface of epitaxial substrate 101 opposite to single-crystal substrate 80 (upper surface in FIG. 1), i.e., is provided in main surface MS. Trench TR has side wall surfaces SW and a bottom surface BT. Each of side wall surfaces SW extends to n drift layer 81 through n region 83 and p base layer 82. Side wall surface SW includes a channel surface of MOSFET 201 on p base layer 82.

Side wall surface SW is inclined relative to main surface MS of epitaxial substrate 101 (upper surface in FIG. 1), and therefore expands in a tapered manner toward the opening of trench TR. Side wall surface SW preferably has a plane orientation inclined relative to a (000-1) plane by not less than 50° and not more than 65°. Preferably, side wall surface SW has a predetermined crystal plane (also referred to as "special plane") particularly at the portion on p base layer 82. Details of the special plane will be described later. Bottom surface BT is located in n drift layer 81. In the present embodiment, bottom surface BT has a flat shape substantially parallel to main surface MS of epitaxial substrate 101.

Gate oxide film 91 covers each of side wall surfaces SW and bottom surface BT of trench TR. Gate electrode 92 is provided on gate oxide film 91. Source electrode 94 is in contact with each of n regions 83 and p contact region 84. Source wiring layer 95 is in contact with source electrode 94. Source wiring layer 95 is, for example, an aluminum layer. Interlayer insulating film 93 insulates between gate electrode 92 and source wiring layer 95.

Figure 3:
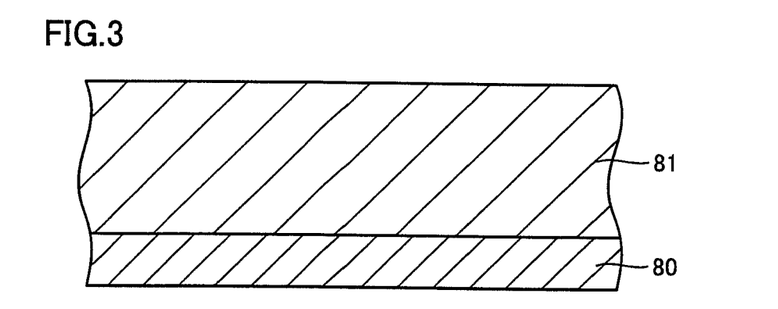
FIG. 3 is a partial cross sectional view schematically showing a first step of a method for manufacturing the silicon carbide semiconductor device of FIG. 1.

As shown in FIG. 3, on single-crystal substrate 80, n drift layer 81 is formed by means of epitaxial growth of silicon carbide. The surface of single-crystal substrate 80 on which the epitaxial growth is performed preferably has an off angle of 8° or less relative to a {000-1} plane, more preferably, has an off angle of 8° or less relative to a (000-1) plane. The epitaxial growth can be performed by means of the CVD (Chemical Vapor Deposition) method. As a source material gas, a mixed gas of silane ($SiH_4$) and propane ($C_3Hg_8$) can be used, for example. In doing so, it is preferable to introduce nitrogen (N) or phosphorus (P) as an impurity, for example.

Figure 4:
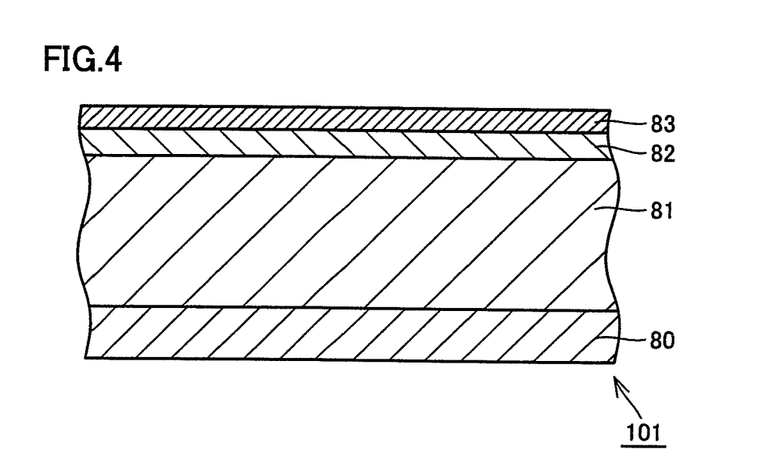
FIG. 4 is a partial cross sectional view schematically showing a second step of the method for manufacturing the silicon carbide semiconductor device of FIG. 1.

As shown in FIG. 4, p base layer 82 and n region 83 are formed on n drift layer 81, thus obtaining epitaxial substrate 101. They can be formed by means of, for example, ion implantation into the entire surface of n drift layer 81. In the ion implantation for forming p base layer 82, ions of an impurity for providing p type conductivity such as aluminum (Al) are implanted. Meanwhile, in the ion implantation for forming n region 83, ions of an impurity for providing n type conductivity such as phosphorus (P) are implanted, for example. It should be noted that instead of the ion implantation, epitaxial growth involving addition of impurities may be employed.

Figure 5:
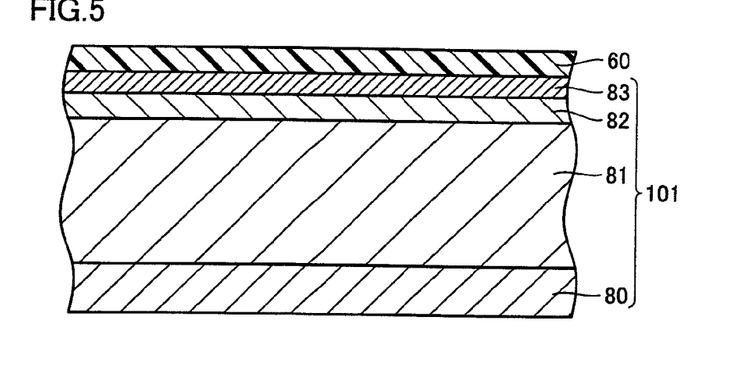
FIG. 5 is a partial cross sectional view schematically showing a third step of the method for manufacturing the silicon carbide semiconductor device of FIG. 1.
Figure 6:
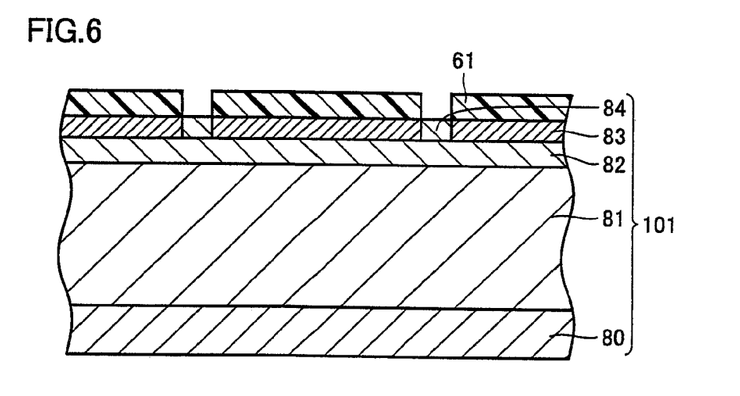
FIG. 6 is a partial cross sectional view schematically showing a fourth step of the method for manufacturing the silicon carbide semiconductor device of FIG. 1.
Figure 7:
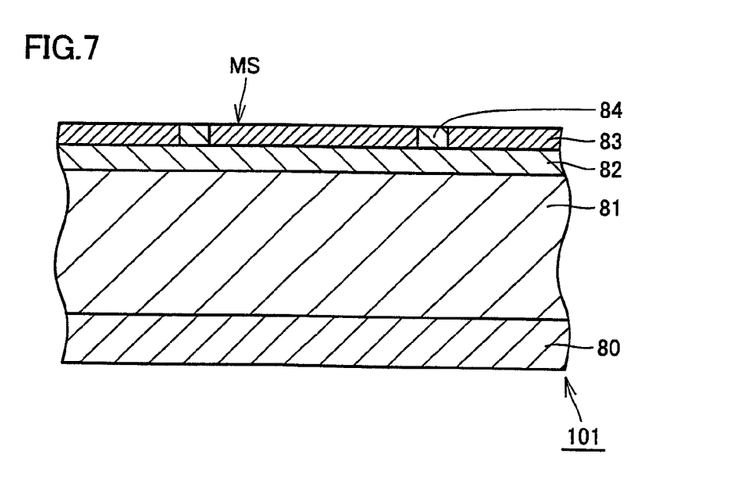
FIG. 7 is a partial cross sectional view schematically showing a fifth step of the method for manufacturing the silicon carbide semiconductor device of FIG. 1.

As shown in FIG. 5, a resist layer 60 is formed on n region 83 of epitaxial substrate 101. Next, exposure and development is performed with regard to resist layer 60. Accordingly, a resist layer 61 (FIG. 6) is formed which has openings in conformity with locations in which p contact regions 84 are to be formed. Next, ion implantation is performed using resist layer 61 so as to form p contact regions 84. Next, resist layer 61 is removed (FIG. 7). Next, heat treatment is performed to activate the impurities. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as argon (Ar) atmosphere.

Figure 8:
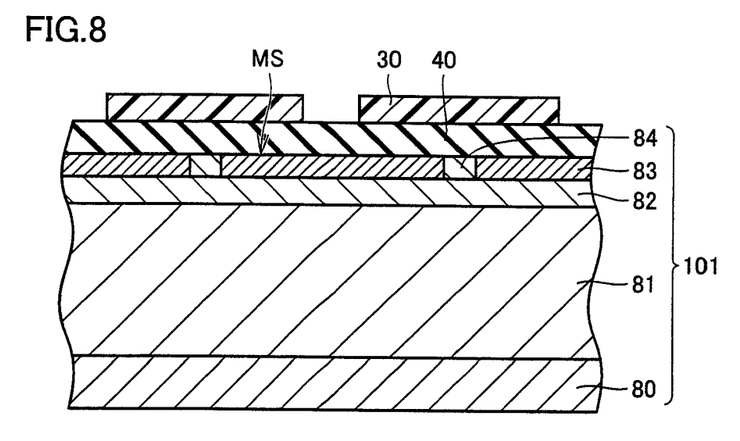
FIG. 8 is a partial cross sectional view schematically showing a sixth step of the method for manufacturing the silicon carbide semiconductor device of FIG. 1.

Referring to FIG. 8, a mask layer 40 (silicon dioxide layer) is first formed on main surface MS including n region 83 and p contact region 84. In other words, epitaxial substrate 101 is prepared which has main surface MS covered with mask layer 40. Preferably, mask layer 40 is formed by thermally oxidizing main surface MS. Next, a photoresist layer 30 having a pattern is formed on mask layer 40 by applying, drying, performing exposure, and performing development of a photoresist. The pattern has an opening formed to correspond to the location of trench TR (FIG. 1).

Figure 9:
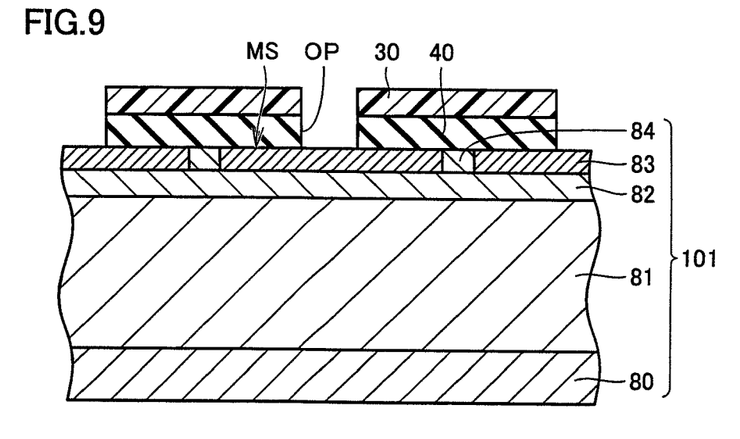
FIG. 9 is a partial cross sectional view schematically showing a seventh step of the method for manufacturing the silicon carbide semiconductor device of FIG. 1.
Figure 10:
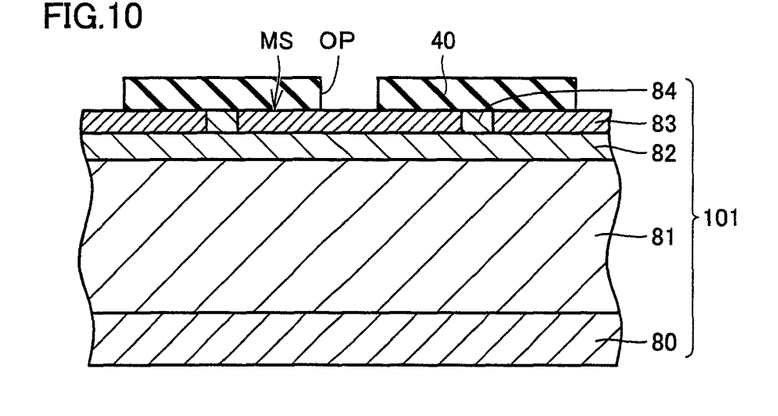
FIG. 10 is a partial cross sectional view schematically showing an eighth step of the method for manufacturing the silicon carbide semiconductor device of FIG. 1.

As shown in FIG. 9, etching is performed using photoresist layer 30 as a mask, thereby providing mask layer 40 with an opening OP through which a portion of main surface MS is exposed. Next, photoresist layer 30 is removed (FIG. 10).

Figure 11:
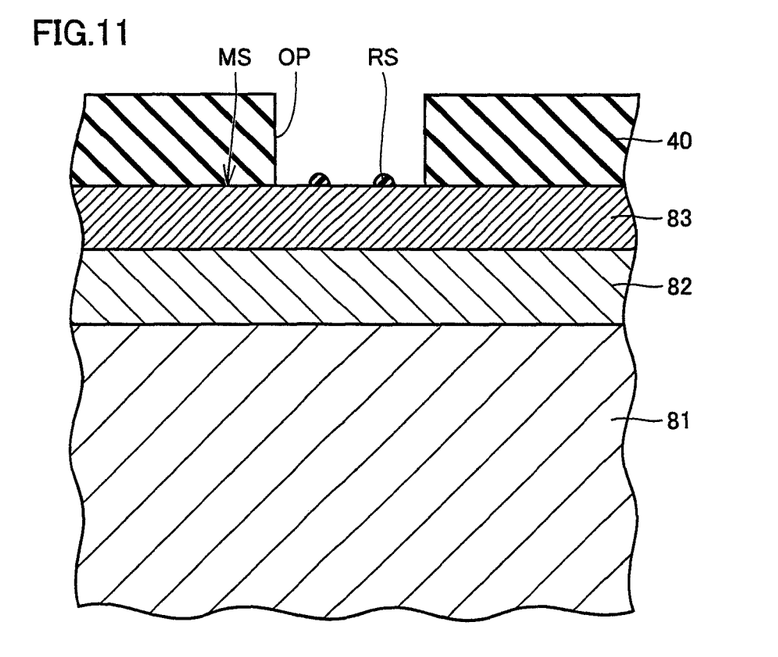
FIG. 11 is an enlarged view of a portion of FIG. 10 so as to show existence of residues.

As shown in FIG. 11, there are residues RS on the exposed portion of main surface MS through opening OP. Residues RS have been formed during the etching for forming opening OP. Residues RS are removed by means of plasma etching in which only an inert gas is introduced. Although it is preferable to remove all the residues RS, not all the residues RS need to be removed. Preferably, the plasma etching is performed under an atmosphere having a remaining oxygen content of approximately 1% or less. For example, before the plasma etching, the etching chamber (not shown) is evacuated to approximately $1 \times 10^{-4}$ Pa or less. Thereafter, the pressure of the plasma etching is set at approximately 0.1 Pa. Accordingly, the remaining oxygen content in the etching chamber during the plasma etching can be approximately 1% or less.

Figure 12:
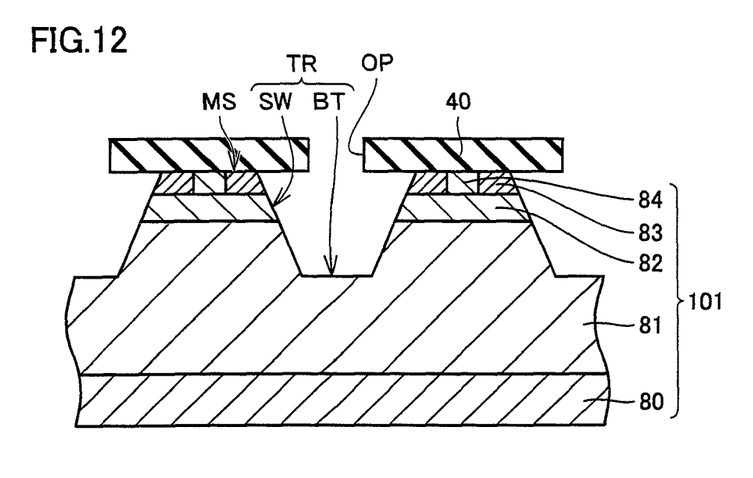
FIG. 12 is a partial cross sectional view schematically showing a ninth step of the method for manufacturing the silicon carbide semiconductor device of FIG. 1.

As shown in FIG. 12, under heating, a reactive gas is supplied to epitaxial substrate 101 having main surface MS covered with mask layer 40 having opening OP formed therein. Accordingly, trench TR is formed in main surface MS of epitaxial substrate 101. In other words, trench TR is formed through thermal etching. The reactive gas in the thermal etching preferably contains a halogen gas. An exemplary, usable halogen gas is chlorine gas. Further, the reactive gas preferably contains oxygen gas. For example, a mixed gas of chlorine gas and oxygen gas is used as the reactive gas. In the thermal etching, epitaxial substrate 101 is set to have a temperature of, for example, not less than approximately 700° C. and not more than approximately 1000° C.

It should be noted that the reactive gas may contain a carrier gas in addition to the chlorine gas and the oxygen gas. An exemplary, usable carrier gas is nitrogen gas, argon gas, or helium gas. When the heat treatment temperature is set at not less than 700° C. and not more than 1000° C. as described above, a rate of etching silicon carbide is approximately, for example, 70 µm/hour. In this case, mask layer 40, which is formed of silicon dioxide and therefore has a very large selection ratio relative to silicon carbide, is not substantially etched during the etching of silicon carbide.

Preferably, during the formation of trench TR, the special plane is spontaneously formed on side wall surface SW, in particular, on p base layer 82. Next, mask layer 40 is removed by means of an appropriate method such as etching.

Figure 13:
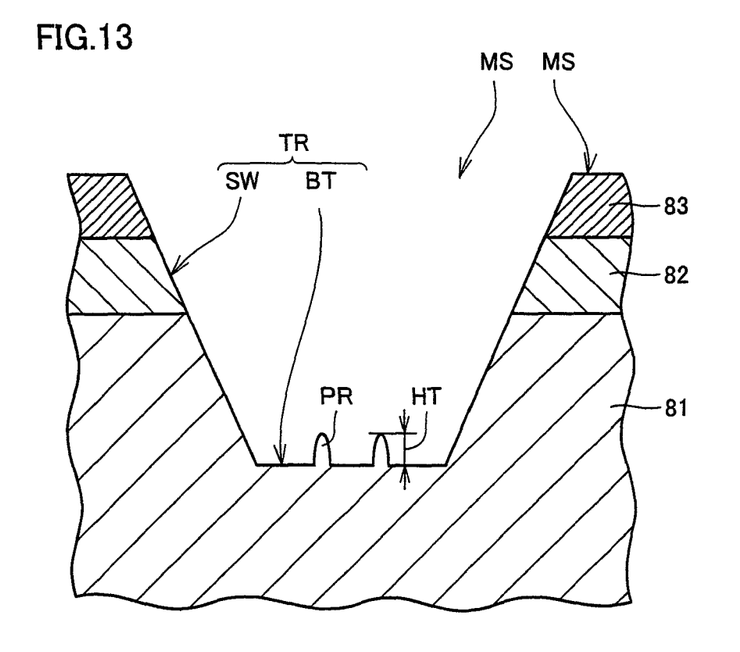
FIG. 13 is a partial cross sectional view schematically showing a tenth step of the method for manufacturing the silicon carbide semiconductor device of FIG. 1.

As shown in FIG. 13, due to influences of residues RS (FIG. 11) existing before the thermal etching, projections PR each having a height HT of 10 nm or more can be formed on main surface MS having trench TR formed therein by the thermal etching. In the present embodiment, residues RS are at least partially removed before the thermal etching as described above. Accordingly, formation of projections PR is suppressed. Preferably, a value obtained by dividing the number of projections PR in whole of main surface MS of epitaxial substrate 101 (FIG. 12) by an entire area of main surface MS of epitaxial substrate 101 (FIG. 12), i.e., the number density of projections PR is 1 $cm^{-2}$ or less.

Figure 14:
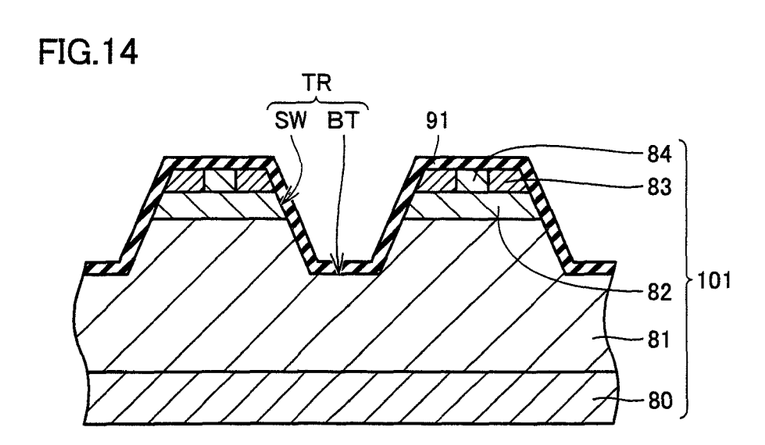
FIG. 14 is a partial cross sectional view schematically showing an eleventh step of the method for manufacturing the silicon carbide semiconductor device of FIG. 1.

As shown in FIG. 14, gate oxide film 91 is formed on side wall surfaces SW and bottom surface BT of trench TR. Gate oxide film 91 can be formed by means of, for example, thermal oxidation.

After the formation of gate oxide film 91, NO annealing may be performed using nitrogen monoxide (NO) gas as an atmospheric gas. A temperature profile has such a condition that the temperature is not less than 1100° C. and not more than 1300° C. and holding time is approximately 1 hour, for example. Accordingly, nitrogen atoms are introduced in an interface region between gate oxide film 91 and p base layer 82. As a result, formation of interface states in the interface region is suppressed, thereby achieving improved channel mobility. It should be noted that a gas other than the NO gas can be employed as the atmospheric gas as long as the nitrogen atoms can be thus introduced.

After this NO annealing, Ar annealing may be further performed using argon (Ar) as an atmospheric gas. The Ar annealing is preferably performed at a heating temperature higher than the heating temperature in the above-described NO annealing and lower than the melting point of gate oxide film 91. This heating temperature is held for approximately 1 hour, for example. Accordingly, formation of interface states in the interface region between gate oxide film 91 and p base layer 82 is further suppressed. It should be noted that instead of the Ar gas, an inert gas such as nitrogen gas can be employed as the atmospheric gas.

Figure 15:
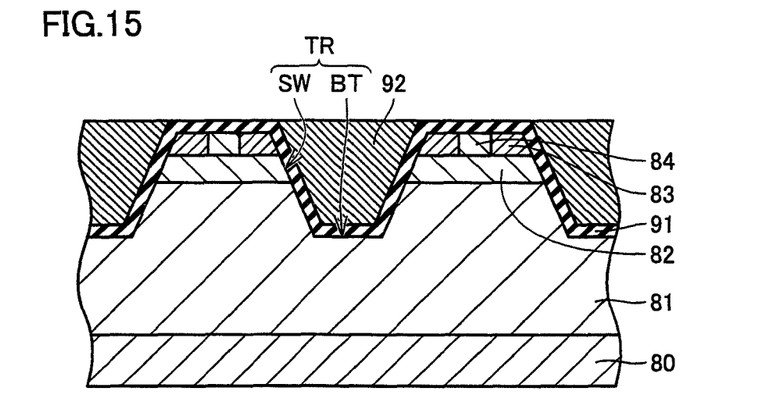
FIG. 15 is a partial cross sectional view schematically showing a twelfth step of the method for manufacturing the silicon carbide semiconductor device of FIG. 1.

As shown in FIG. 15, gate electrode 92 is formed on gate oxide film 91. Specifically, gate electrode 92 is formed on gate oxide film 91 so as to fill the region within trench TR with gate oxide film 91 interposed therebetween. Gate electrode 92 can be formed by, for example, forming a film of conductor or doped polysilicon and performing CMP.

Figure 16:
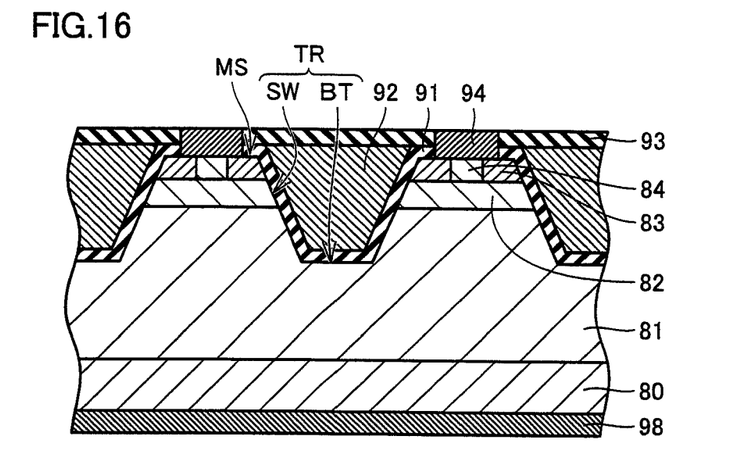
FIG. 16 is a partial cross sectional view schematically showing a thirteenth step of the method for manufacturing the silicon carbide semiconductor device of FIG. 1.

Referring to FIG. 16, interlayer insulating film 93 is formed on gate electrode 92 and gate oxide film 91 so as to cover the exposed surface of gate electrode 92. Etching is performed to form openings in interlayer insulating film 93 and gate oxide film 91. Through the openings, each of n region 83 and p contact region 84 is exposed on main surface MS. Next, on main surface MS, source electrode 94 is formed in contact with each of n region 83 and n contact region 84. Drain electrode 98 is formed on n drift layer 81 with single-crystal substrate 80 interposed therebetween.

Referring to FIG. 1 again, source wiring layer 95 is formed. In this way, MOSFET 201 is obtained.

According to the present embodiment, only the inert gas is introduced during the plasma etching for removing residues RS (FIG. 11). Accordingly, when removing existing residues RS, new residues RS can be prevented from being formed by chemical reaction. Hence, thermal etching can be performed with fewer residues RS. This suppresses formation of projections PR (FIG. 13) during the thermal etching. Accordingly, the breakdown voltage can be suppressed from being decreased due to surface roughness in trench TR.

Preferably, the plasma etching is performed under an atmosphere having a remaining oxygen content of 1% or less. Accordingly, new residues RS can be suppressed from being formed due to oxidation reaction. Preferably, the reactive gas contains a halogen gas. Accordingly, the thermal etching can be performed using a reaction between the halogen gas and the silicon carbide. Preferably, the reactive gas contains oxygen gas. Accordingly, carbon generated during the thermal etching is removed efficiently, thereby increasing a rate of the thermal etching. Preferably, an number density of projections PR (FIG. 13) each having a height of 10 nm or more is 1 $cm^{-2}$ or less on main surface MS having trench TR formed therein. Accordingly, the breakdown voltage can be sufficiently suppressed from being decreased due to surface roughness in trench TR.

The following fully describes the "special plane" described above. As described above, side wall surface SW preferably has the special plane. Now, this case will be described below.

Figure 17:
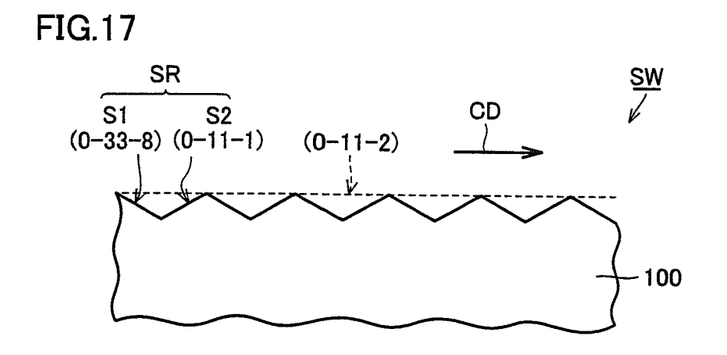
FIG. 17 is a partial cross sectional view schematically showing a microscopic structure of a side wall surface having a special plane.

As shown in FIG. 17, side wall surface SW having the special plane has a plane S1 (first plane). Plane S1 has a plane orientation of {0-33-8}, and preferably has a plane orientation of (0-33-8). Preferably, side wall surface SW microscopically includes plane S1. Preferably, side wall surface SW further microscopically includes a plane S2 (second plane). Plane S2 has a plane orientation of {0-11-1}, and preferably has a plane orientation of (0-11-1). Here, the term "microscopically" refers to "minutely to such an extent that at least the size about twice as large as an interatomic spacing is considered". As a method for observing such a microscopic structure, for example, a TEM (Transmission Electron Microscope) can be used.

Preferably, side wall surface SW has a combined plane SR. Combined plane SR is constituted of periodically repeated planes S1 and S2. Such a periodic structure can be observed by, for example, TEM or AFM (Atomic Force Microscopy). Combined plane SR has a plane orientation of {0-11-2}, and preferably has a plane orientation of (0-11-2). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, in the channel surface, carriers flow in a channel direction CD, in which the above-described periodic repetition is done.

The following describes detailed structure of combined plane SR.

Figure 18:
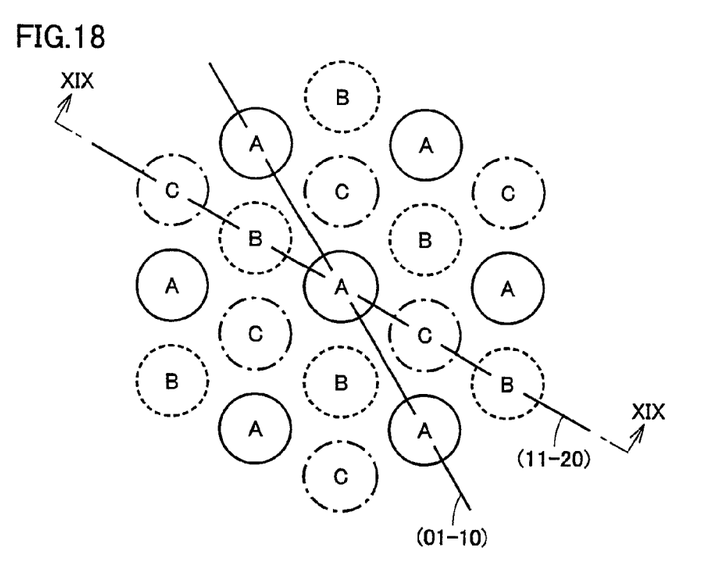
FIG. 18 shows a crystal structure of a (000-1) plane in a hexagonal crystal of polytype 4H.

Generally, regarding Si atoms (or C atoms), when viewing a silicon carbide single-crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 18. In other words, with four layers ABCB being regarded as one period, a periodic stacking structure such as ABCBAB-CBABCB . . . is provided.

Figure 19:
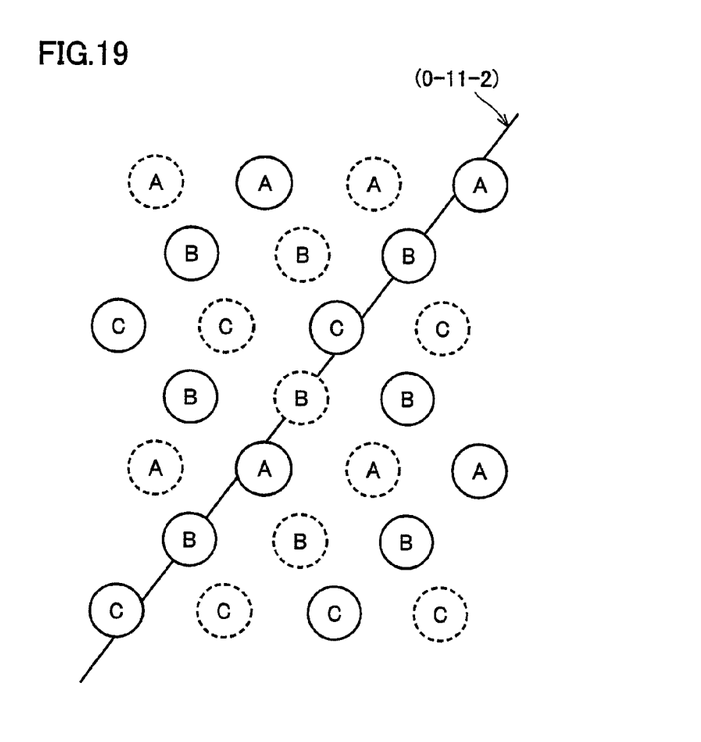
FIG. 19 shows a crystal structure of a (11-20) plane along a line XIX-XIX in FIG. 18.

As shown in FIG. 19, in the (11-20) plane (cross section taken along a line XIX-XIX of FIG. 18), atoms in each of four layers ABCB constituting the above-described one period are not aligned completely along the (0-11-2) plane. In FIG. 19, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single-crystal, i.e., the plane orientation thereof with its atomic level structure being ignored is limited to (0-11-2), this surface can have various structures microscopically.

Figure 20:
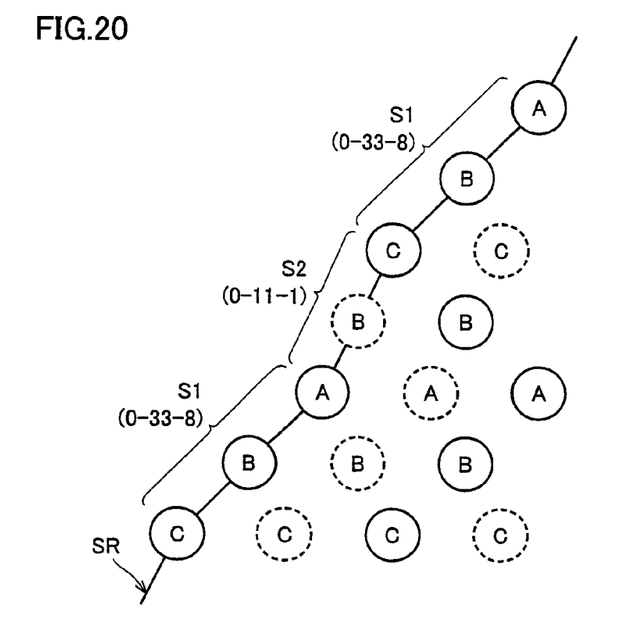
FIG. 20 shows a crystal structure of a combined plane of FIG. 17 in the vicinity of the surface within the (11-20) plane.

As shown in FIG. 20, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 19).

Figure 21:
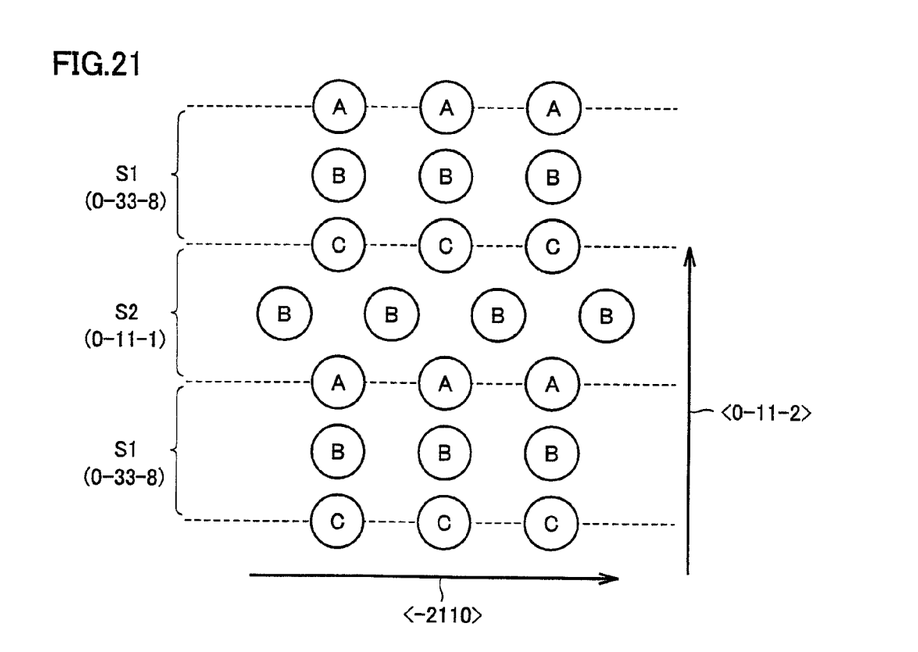
FIG. 21 shows the combined plane of FIG. 17 when viewed from a (01-10) plane.

As shown in FIG. 21, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 21) having a plane orientation of (001) in the structure equivalent to the cubic structure and the planes (planes S2 in FIG. 21) connected to the foregoing planes and having a plane orientation different from that of each of the foregoing planes. The polytype may be, for example, 6H or 15R.

Figure 22:
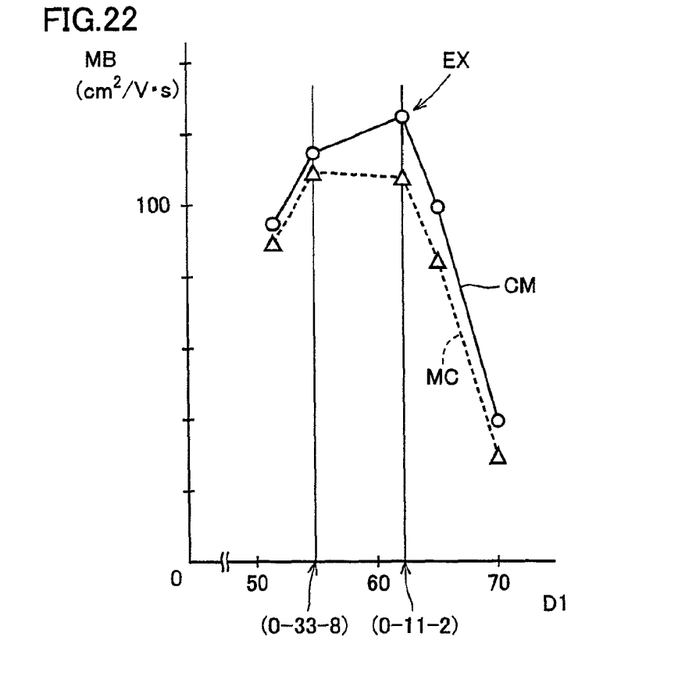
FIG. 22 is a graph showing an exemplary relation between channel mobility and an angle between a channel surface and the (000-1) plane when macroscopically viewed, in each of a case where thermal etching is performed and a case where no thermal etching is performed.

Referring to FIG. 22, the following describes a relation between the crystal plane of side wall surface SW and mobility MB in the channel surface. In the graph of FIG. 22, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to correspond to the special plane by the thermal etching, whereas a group of plots MC correspond to a case where side wall surface SW is not thermally etched.

In group of plots MC, mobility MB is at maximum when the surface of the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 20 and FIG. 21, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 23:
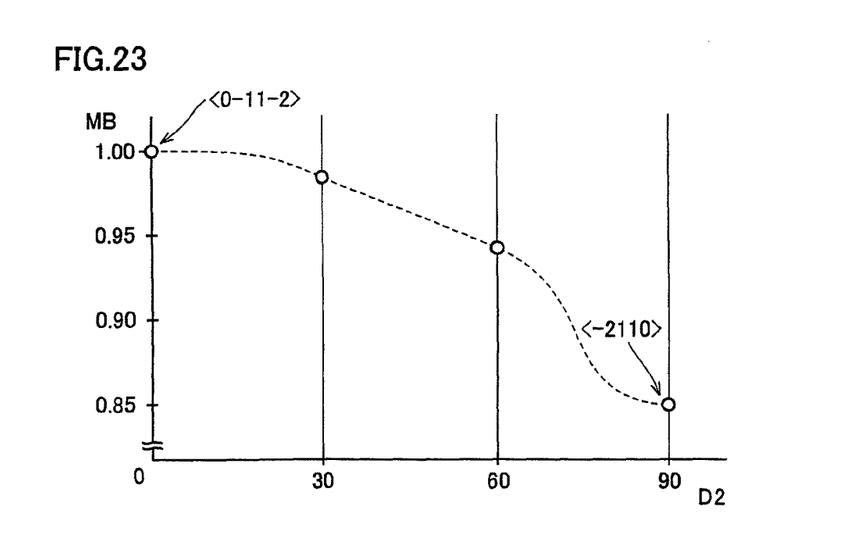
FIG. 23 is a graph showing an exemplary relation between the channel mobility and an angle between a channel direction and a <0-11-2> direction.

It should be noted that mobility MB has orientation dependency on combined plane SR. In a graph shown in FIG. 23, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 17) preferably has an angle D2 of not less than 0° and not more than 60°, more preferably, substantially 0°.

Figure 24:
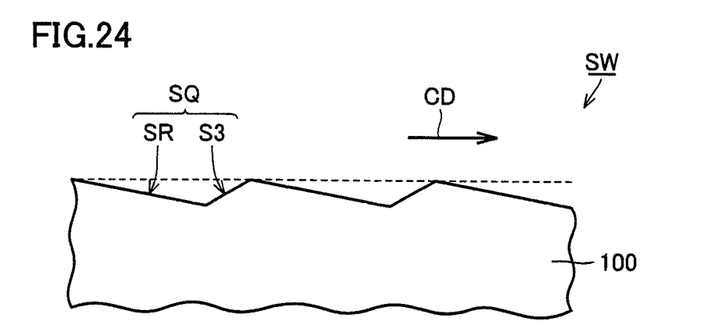
FIG. 24 shows a modification of FIG. 17.

As shown in FIG. 24, side wall surface SW may further include plane S3 (third plane) in addition to combined plane SR (illustrated by a straight line in a simplified manner in FIG. 24). In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10° Examples of a surface included in such an angle range include a surface having a macroscopic plane orientation of the (0-33-8) plane.

More specifically, side wall surface SW may include a combined plane SQ constituted of periodically repeated plane S3 and combined plane SR. Such a periodic structure can be observed by, for example, TEM or AFM (Atomic Force Microscopy).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device, comprising the steps of:

preparing a silicon carbide substrate having a main surface covered with a silicon dioxide layer;

forming a photoresist layer having a pattern on said silicon dioxide layer;

forming an opening in said silicon dioxide layer through etching with said photoresist layer being used as a mask, so as to expose a portion of said main surface through said opening, a residue resulting from said etching being on said portion of said main surface exposed through said opening;

removing said residue by plasma etching in which only an inert gas is introduced;

after the step of removing said residue, forming a trench, which has a side wall surface, in said main surface of said silicon carbide substrate by supplying a reactive gas, under heating, to said silicon carbide substrate having said main surface covered with said silicon dioxide layer having said opening formed therein;

forming a gate insulating film on said side wall surface of said trench; and forming a gate electrode on said gate insulating film.

2. The method for manufacturing the silicon carbide semiconductor device according to claim 1, wherein said plasma etching is performed under an atmosphere having a remaining oxygen content of 1% or less.

3. The method for manufacturing the silicon carbide semiconductor device according to claim 1, wherein said reactive gas contains a halogen gas.

4. The method for manufacturing the silicon carbide semiconductor device according to claim 3, wherein said reactive gas contains oxygen gas.

5. The method for manufacturing the silicon carbide semiconductor device according to claim 1, wherein a number density of projections each having a height of 10 nm or more is 1 $cm^{-2}$ or less on said main surface having said trench formed therein.

\* \* \* \* \*